United States Patent [19]

Chen

[11] Patent Number: 4,963,755

[45] Date of Patent: Oct. 16, 1990

[54] METHOD FOR ENHANCEMENT OF USEFUL LUMINESCENCE FROM VACANCY DEFECTS IN REFRACTORY OXIDES FOR TUNABLE LASERS

[75] Inventor: Yok Chen, Oak Ridge, Tenn.

[73] Assignee: The United States of America as represented by the Department of Energy, Washington, D.C.

[21] Appl. No.: 243,534

[22] Filed: Sep. 12, 1988

[51] Int. Cl.$^5$ .................... C09K 11/55; C09K 11/67
[52] U.S. Cl. .................... 250/492.3; 252/301.4 R; 423/635; 423/636
[58] Field of Search ................ 252/301.4 R; 423/635, 423/636; 250/492.3

[56] References Cited

U.S. PATENT DOCUMENTS 3,829,391  8/1974  Chen et al. .................. 252/301.4 R
4,604,225  8/1986  Chen et al. .................. 252/301.4 R

OTHER PUBLICATIONS

Y. Chen, "Electron Trapping Properties and Sensitivity to Ionizing Radiation of the Hydride Ionin Refractory Oxides", Crystal Latt. Def. and Amorph. Mat., 12 149, (1985).

Primary Examiner—Jack Cooper
Attorney, Agent, or Firm—David E. Breeden; Stephen D. Hamel; William R. Moser

[57] ABSTRACT

Refractory oxide crystals suitable for use in tunable lasers and a method for preparing the same are provided. The crystals are characterized by high quantum efficiency, high thermal stability, good crystal transparency, and a high percentage of useful luminescence. The method for preparation of the crystals involves removing substantially all the hydrogen, thermochemically reducing the crystal's oxygen content to produce oxygen (anion) vacancy defects, and subsequently irradiating the crystal with electrons to inactivate trace $H^-$ ions so that an increased amount of short lived $F^+$ luminescence is produced when the crystal is optically excited.

3 Claims, 2 Drawing Sheets

METHOD FOR ENHANCEMENT OF USEFUL LUMINESCENCE FROM VACANCY DEFECTS IN REFRACTORY OXIDES FOR TUNABLE LASERS

BACKGROUND OF THE INVENTION

This invention, which is a result of a contract with the U.S. Department of Energy, relates to crystals and methods of making the same having desirable luminescence characteristics for possible use as host materials in tunable lasers.

It has long been known that refractory oxide crystals luminesce when optically excited through exposure to particular wavelengths of light, and this phenomenon is used to advantage in various devices such as lasers, photon detectors, image converters, and other quantum electronic solid state devices.

In general, both impurities and vacancies in a given crystal give rise to optical absorption bands, which when optically excited result in luminescence. These crystals have been used as laser host materials whose outputs may be tuned to yield monochromatic coherent light over a certain wavelength region covered by the luminescence spectrum of the crystal. Lasers using impurities have been much more common because impurities (such as chromium in the classic ruby laser) are thermally more stable than lasers using vacancies. However, vacancies have three main advantages over impurities: (1) The oscillator strength of the absorption is generally much higher; therefore, the required concentration of the lasing species is much lower. For many impurity ions, the oscillator strengths are small (approx. $10^{-5}$) and concentrations of approximately 1% are required. This magnitude can normally be expected to yield complications involving alloying, precipitations and severe grain boundary problems. For vacancies, the oscillator strengths in absorption is typically unity and therefore concentrations of only approximately 0.0001% are adequate. (2) The broader luminescence bands in principle offer a broader tuning range. The half widths of absorption bands and luminescence bands of vacancies are larger than those of impurities, typically a 5:1 ratio. (3) The broad absorption bands permit optical pumping by a correspondingly broad wavelength spectrum of an incoherent exciting source.

However, there are two disadvantages of vacancies in refractory oxide crystal systems (such as MgO, CaO, Al$_2$O$_3$, and SrO) for tunable laser hosts, as compared with impurities: (1) the thermal instability of vacancies produced by conventional methods, such as irradiations with electrons or neutrons, and (2) luminescence in thermochemically reduced crystals is long-lived (greater than approximately 1 second).

In the art it has been the practice to produce vacancies in refractory oxide crystals by exposing single crystals of the oxide to either electron or neutron radiation over an extended period of time at about 300° K. This technique is disclosed by B. Henderson in Optics Letters, Vol. 6, No. 9, pp. 437–439 (September 1981). Vacancies produced in this manner are not stable because they are annihilated at temperatures not much higher than room temperature, thus restricting their use. These crystals must be cooled to prevent annihilation of the vacancies by interstitial-vacancy recombination. Furthermore, cooling is necessary to obtain acceptable quantum efficiency. Another shortcoming of the irradiated crystals is that exciting into the absorption band of the F+ center gives rise to trapped hole centers which are a detriment to continuous-wave (cw) tunable laser action. Irradiated oxide crystals are generally not desirable hosts for cw tunable lasers.

In general, anion vacancies in oxides assume two charge states: the one-electron F+ center and the two-electron F center. While the absorption bands of these two charge states in most oxides occur at different wavelengths, in MgO they coincide at 5.0 eV (250 nm). In MgO, CaO and SrO irradiated with energetic particles, the preferred charge state is the F+ center. Excitation of MgO with 5.0 eV light produces the F+ luminescence at 3.1 eV (395 nm) with a FWHM (full width at half maximum) of 0.6 eV. Such broad emission in principle permits a broad tuning range for laser action. When the electron of an F+ center is in an excited state, the strong polarization at the vacancy demands an electron from a nearby O$^{2-}$ ion, thereby leaving behind a hole. The hole migrates and is trapped by a magnesium vacancy charge-compensated by an impurity inherently present in MgO crystals, such as Al$^{3+}$ and H+, to form the V$_{Al}$ or V$_{OH}$ centers, whose linear configurations are Al$^{+3}$-[Mg vacancy]-O— and OH—-[Mg vacancy]-O—, respectively. The O— refers to an O$^{2-}$ ion with a trapped hole. These trapped hole centers give rise to broad absorption bands with a FWHM of 1.1 eV at 300° K., with peaks at about 2.3 eV (540 nm). These centers are metastable and have a half-life for hole-release of a few hours at 300° K. They obviously are a strong deterrent to producing cw lasing action in the region of their optical absorption.

Irradiation with high-energy electrons to produce F+ centers has essentially the same effect and offers no advantage. In fact, the concentration of the trapped-hole centers increases. Substitutional protons in the crystals are displaced by the ionizing electrons with a phenomenally large cross section ($10^8$ barns), resulting in the intrinsic V— center (linear configuration: O$^{2-}$-[Mg vacancy]-O—). This center also absorbs at 2.3 eV but has a half-life for hole release of several months, thereby compounding an already undesirable problem. An absorption coefficient as large as 25 cm$^{-1}$ has been observed. Furthermore, electron irradiations are expensive and time consuming. Irradiation levels between $10^{18}$ and $10^{19}$ electrons/cm$^2$ for many hours in a Van de Graaff generator are required. The sample temperature during irradiation cannot exceed 360° K. without annihilation. This requirement adds to the long irradiation time.

These considerations are not restricted to MgO. Trapped-hole centers in several oxides have been identified by electron paramagnetic resonance studies. They generally give rise to broad absorption bands in the visible and near-visible region. In CaO and Al$_2$O$_3$ the bands peak at 1.85 (670 nm) and 3.0 eV, (400 nm) respectively.

Although neutrons may be used to create vacancies in less time, there still exists the problem of thermal instability. The reason is that interstitials are created during irradiation, and being much more mobile than vacancies they readily recombine with vacancies. However, if there are no interstitials created, as with the thermochemically reduced crystals, the vacancies can survive at much higher temperatures.

In thermochemically reduced crystals there exists a long-lived component of the F center luminescence, which is detrimental for use as a laser host. It is due to the presence of hydride ions (H— ions). Luminescence lifetimes of roughly $10^{-8}$ to $10^{-6}$ seconds are desirable for cw laser hosts. Therefore, in order to provide a refractory oxide host for tunable cw laser applications, hydrogen must be removed from the crystal.

High quantum efficiency, high oscillator strength and thermally stable refractory oxide laser host crystals can be provided by removing the hydrogen from a high purity refractory oxide crystal and subsequently thermochemically reducing the crystal to produce oxygen (anion) vacancies therein. Details of such a method may be had by referring to U.S. Pat. No. 4,604,225, issued Aug. 5, 1986 to Chen et al for "Refractory Oxide Hosts For a High Power, Broadly Tunable Laser With High Quantum Efficiency And Method Of Making Same", and having a common assignee with the present invention. The contents of the above referenced patent being incorporated herein by reference thereto.

As described in the above referenced patent, hydrogen may be removed from a high purity single crystal of the refractory oxide by irradiating the crystal with an ionizing radiation or heating the crystal to break the OH— bonds while applying an electric field to the crystal to force the freed protons to be swept to the cathode electrode. Following the hydrogen removal, the crystals are subjected to a thermochemical reduction process to stoichiometrically reduce the oxygen ions, thereby creating oxygen anion vacancies due to the deficiency of oxygen ions without oxygen interstitials.

While thermochemical reduction is an advantages means of preparing refractory oxide crystals for laser host materials, there are two serious problems: (1) long-lived phosphorescence from anion vacancies, and (2) crystal darkening. In thermochemically reduced oxide crystals containing low hydrogen concentrations, there still exists a component of the F+ luminescence which is low in intensity but can persist for periods as long as about one second. This phosphorescence component, in excess of 1 microsecond, can constitute more than 80% of the integrated luminescence intensity and is therefore detrimental to achieving laser action. In order to make the material useful, it is necessary to transform this long-lived component into short-lived (nanosecond) luminescence.

Further, thermochemically reduced oxide crystals tend to have broad absorption bands introduced by impurity metal precipitates that cause darkening of the crystal even in highly pure crystals. In MgO crystals this darkening appears to be due to the presence of iron precipitates.

Thus, there is a need to provide an improved refractory oxide crystal for use as a host material for tunable lasers and a method of preparing the same.

SUMMARY OF THE INVENTION

In view of the above need, it is an object of this invention to provide a refractory oxide material having a high percentage of useful luminescence and which is not subject to darkening.

It is another object of this invention to provide a method of enhancing the useful luminescence of refractory oxide crystals.

Yet another object of this invention is to provide a method for preparation of refractory oxide crystals having low hydrogen concentration to serve as a laser host material with enhanced luminescence.

Further, it is an object of this invention to provide a method for preparation of refractory oxide laser host crystals in which trace amounts of H— ions are inactivated to achieve a high fraction of useful (short-lived) luminescence.

Still a further object of this invention is to provide a method for preparing refractory oxide crystals suitable as laser host materials which are not subject to crystal darkening.

Briefly, the present invention is a refractory oxide crystal for use as a laser host material characterized by high quantum efficiency, high thermal stability, low hydrogen content, high transparency, and short-lived luminescence following optical excitation.

Further, the invention encompasses a method for making refractory oxide crystals as characterized above comprising the steps of:

1. Removing hydrogen from a high purity single crystal of a refractory oxide to a level of less than about $10^{13}$ protons/cm$^3$;
2. Thermochemically reducing said crystal at a sufficiently high temperature and pressure in an atmosphere of the cation vapor of the refractory oxide to form oxygen anion vacancies in the crystal and substantially remove impurities by means of out diffusion during thermochemical reduction; and
3. Irradiating the thermochemically reduced crystal with electrons in the range of from about $1 \times 10^{17}$ to $1 \times 10^{18}$ electrons/cm$^2$ for a period sufficient to inactivate H— ions, thereby improving the useful luminescence of the crystal following optical excitation.

DETAILED DESCRIPTION

Figure 1:
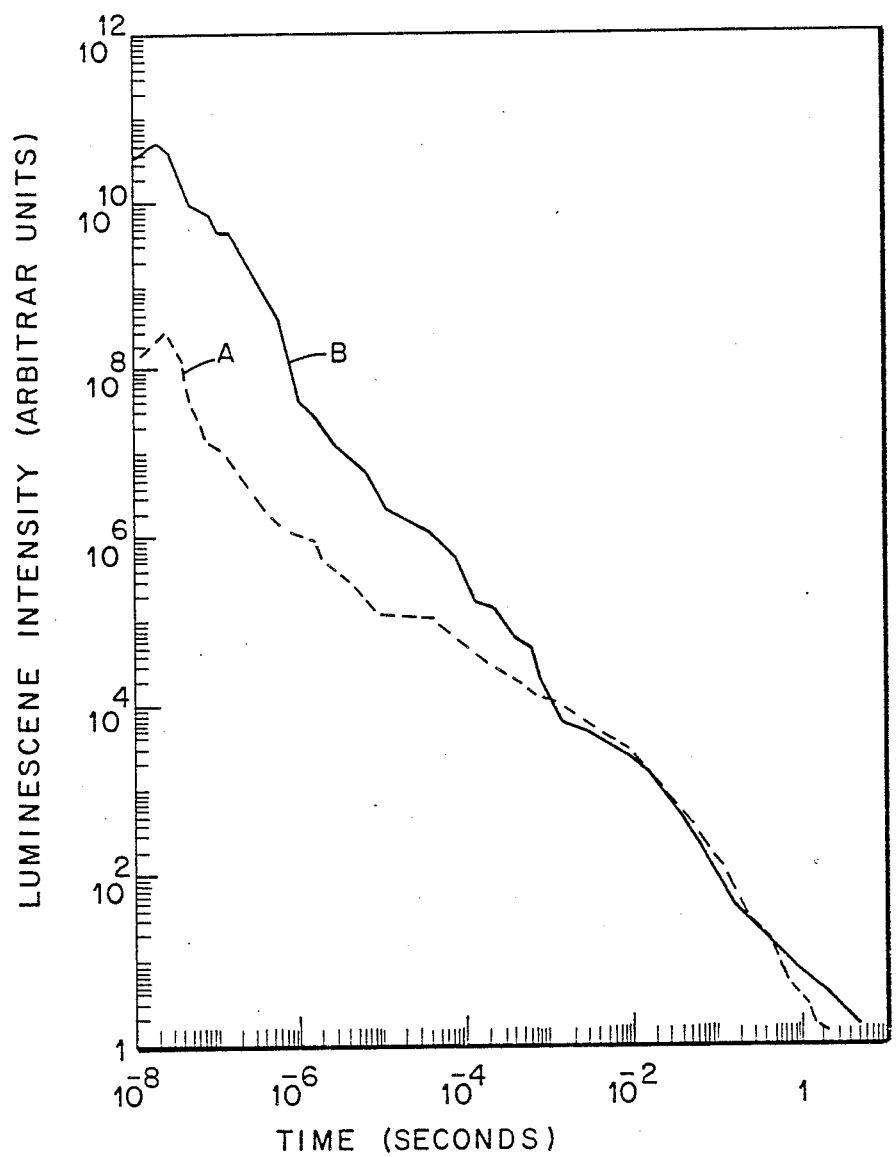
FIG. 1 is a graph comparing the luminescence intensity in arbitrary units versus time in seconds following 5.0 eV photon-excitation of an MgO crystal before and after the final step of electron irradiation for the purpose of enhancing short-lived luminescence according to the present invention.

Vacancy defects in alkaline-earth oxides, such as MgO, CaO, and SrO, to form tunable laser host materials are preferably produced by heating single crystals of the material to a temperature sufficient to release the H— ions within the crystal while applying an electric field across the crystal of about 2000 volts/cm to sweep protons to the cathode followed by thermochemical reduction of oxygen to provide oxygen vacancies. The electric field is applied by means of specially provided electrodes on opposite faces of the crystals. Electrical contact may be made by coating the opposite surfaces with a precious metal contact (gold-platinum ink). The crystal so configured is heated to about 1300° K. for about 1 hour in a dry nitrogen atmosphere to remove most of the hydrogen. The amount of residual hydrogen should be less than about $10^{13}$ protons/cm$^3$.

Once the crystal has been depleted in hydrogen, the crystal is processed thermochemically to reduce the oxygen content. The crystal is placed in a tantalum basket which is inserted into a tantalum tube having one end sealed with a welded tantalum plug. Metal particles are also placed in the tube. The metal is preferably an element belonging to the cation of the crystal which is to be thermochemically reduced (Mg metal for MgO;

Ca for CaO; etc.). The tube is then vacuum-sealed with a tantalum plug welded in the open end of the tube. The tube is then heated in an evacuated chamber at sufficiently high temperatures to create oxygen vacancies and promote out diffusion of metallic impurities. Typically, according to the method of this invention the crystals are heated to a temperature sufficient to not only enhance the outdiffusion of protons (H), but trace metallic impurities normally present in high purity refractory oxide crystals. It has been found that by increasing the thermochemical reduction step temperature by about 100° to 300° C. above that used in the reduction step in the above referenced patent, metallic impurities which form metallic precipitates during the reduction step and subsequent crystal darkening are substantially removed.

Typically, the crystals are heated to temperatures in the range of from about 1800° to 2500° C. during the thermochemical reduction step. At this temperature, the added metal evaporates and the pressure of the metal vapor surrounding the sample is several atmospheres. Thermochemical reduction is taking place. Under these conditions, there exists a stoichiometric imbalance due to a deficiency of oxygen ions, resulting in the formation of oxygen anion vacancies. Using this process, most defect vacancies formed in the crystal are primarily of the F center type (oxygen vacancy with two electrons). However, if there is any hydrogen available in the crystal, a proton can occupy a vacancy to form an H− ion (a proton with two electrons in an oxygen vacancy). The presence of H− ions has been determined to be the cause of long-lived luminescence in thermochemically reduced refractory oxide crystals which is detrimental in their use as laser host devices.

The equation for the optical gain coefficient $\alpha$ is $$\alpha = \sigma N^* = 0.037 \frac{\lambda_o^2 \eta}{n^2 (\Delta \nu) \tau} N^*;$$

where $\alpha$ is the cross section, $\eta$ is the quantum efficiency, $\lambda_o$ is the peak wavelength of the luminescence band, $\Delta \gamma$ is the band half-width, n is the index of refraction, $\tau$ is the luminescence lifetime, and $N^*$ is the excited-state population. It can be seen from the equation that the luminescence lifetime, $\tau$, is a key parameter in obtaining a high gain coefficient. Luminescence lifetimes can vary from $10^{-9}$ to $10^{-3}$ second, and are frequently as long as $10^3$ seconds in thermochemically reduced crystals (CaO:Ca and MgO:Mg). As pointed out above, the reason for the long luminescence lifetime in CaO:Ca and MgO:Mg has been determined to be associated with the presence of H− ions (i.e. proton with two electrons in an oxygen vacancy). During thermochemical reduction, oxygen vacancies are formed with the natural state being the neutral 2-electron F center. If hydrogen is present, a portion can be trapped by the vacancy to form an H− ion. In MgO and CaO, the H− ions can be identified by a series of bands which absorb light in the vicinity of wavelengths of 1000 cm$^{-1}$. The H− ion is positively charged and can also be denoted as a [H−]+ center. The H− ion is an F center (oxygen vacancy with 2 electrons and is therefore neutral) with a trapped proton (H+) and is therefore positively charged. F centers and H− ions normally co-exist in a thermochemically reduced crystal. During optical pumping of the F band in MgO, an electron from the $^1A_{lg}$ ground state is excited to a diffuse $^1T_{lu}$ state which lies < 0.01 eV below the conduction band. There exists a high probability that the electron can be thermally stimulated into the conduction band, from which it can be trapped by an H− ion, thus forming an H$^{2-}$ ion and leaving behind an F+ center. Near room temperature, the H$^{2-}$ is metastable and the outermost electron is thermally excited into the conduction band. It can either return to a positively charged F+ center, resulting in F-emission, or be captured by another positively charged H− ion, thereby further delaying the inevitable return to the F+ center. It is this successive capture by H− ions that leads to the long phosphorescence lifetime. A relatively high H− concentration implies a high probability for successive capture by H− ions, resulting in a long-lived luminescence.

In accordance with the present invention, it has been found that the remaining trace quantities of hydrogen in the form of H− ions can be immobilized following thermochemical reduction to form anion vacancies by a short electron irradiation step. The subsequent electron irradiation step, typically 10 minutes with 1.8 MeV electrons with an electron current of about 5 microamps/cm$^2$, displaces the protons to other sites to form OH− ions leaving behind oxygen vacancies. The electron irradiation intensity need only be sufficient to penetrate the crystal body.

Thus it will be seen that the additional electron irradiation step does not get rid of the trace protons, but serves to put them into inactive sites within the crystal structure. This procedure performs three tasks simultaneously: (1) increases the steady state F+ luminescence intensity at the expense of the F luminescence, (2) increases the F+ quantum efficiency, and (3) decreases the overall luminescence lifetime.

The invention will be explained in greater detail in the following example.

EXAMPLE

Clear, high purity single crystals of CaO and MgO obtained from Mallinckrodt Chemical Company, St. Louis, Mo., and Tateho Chemical Company, Tokyo, Japan, respectively, were each prepared with electrodes as described above and heated to 1300° K. in a dry nitrogen atmosphere for 70 minutes with an applied electric field of 2000 volts/cm$^2$ to sweep out the hydrogen content to a level of less than $10^{13}$ protons/cm$^3$ as measured by infrared absorption in the region of 3000–4000 cm$^{-1}$. The MgO crystal was thermochemically reduced in 4 atmospheres of magnesium vapor at about 2100° K. for 4 hours in a sealed tantalum tube as described above. The CaO crystal was treated likewise in 4 atmospheres of calcium vapor at about 2000° K. for 2 hours in a sealed tantalum tube. Anion vacancies were produced, about $10^{17}$ to $10^{18}$ vacancies/cm$^3$ in both the MgO and the CaO as determined from the optical absorption of the anion vacancy bands. The crystals were subsequently irradiated with 1.8 MeV electrons from a Van de Graaff generator at a dose of $5 \times 10^{17}$ electrons/cm$^2$. It was estimated that 50 to 95% of the protons were inactivated.

The luminescence of these crystals were compared with that obtained following the steps of only electric field sweeping treatment followed by thermochemical reduction. Crystals receiving only the electric field sweeping and thermochemical reduction steps exhibited two decay components after being exposed to 248 nanometer wavelength light pulses of 18 nanosecond duration from a KrF excimer laser with 70 mJ/cm$^2$ per pulse. The time resolved luminescence yields an F+ fraction having a lifetime of less than 10 nanoseconds and a low-lying component of F+ and F luminescence which extended over times as long as 2 seconds. The fast (useful) component comprised only 14% of the total luminescence in these crystals. However, crystals receiving the electron irradiation following thermochemical reduction, as in the present method, when given the same laser exposure, exhibited about 90% of the fast F+ luminescence component. This result is illustrated in the graphs of FIG. 1 which compares the luminescence intensities of an MgO crystal before the electron irradiation step (curve A) and following the electron irradiation step (curve B) following 18 ns excitation by 248 nm wavelength light pulses at room temperature. As shown, there is about an order of magnitude increase in the useful luminescence from the crystal when prepared according to the method of the present invention.

Figure 2:
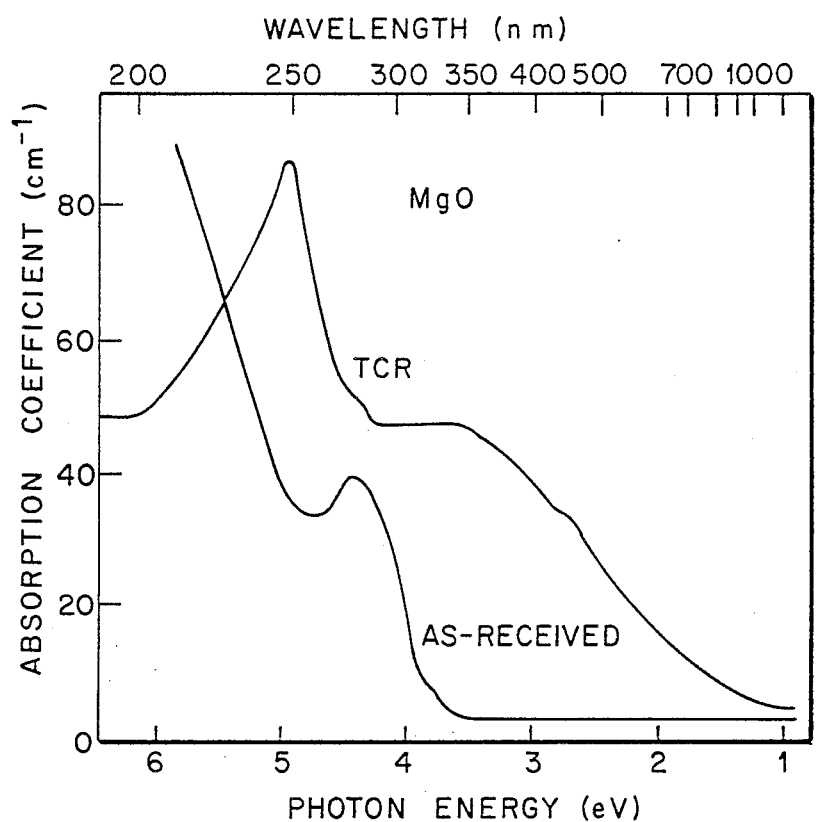
FIG. 2 is a plot of absorption coefficient (cm$^{-1}$) as a function of photon energy or wavelength and illustrates the optical extinction in the visible region due to Mie scattering from metallic precipitates in an MgO crystal.

As discussed above, thermochemical reduction also results in crystal darkening in MgO crystals. The extent of the darkening depends on the crystal purity prior to processing. The larger the impurity content, the darker the crystals become. The dark coloration was found to be due to optical extinction in the visible region due to Mie scattering from metallic precipitates in the crystals. Even in high-purity MgO crystals, occasional light-brown streaks can be detected over parts of the crystal. In a impure crystal, it becomes completely black after thermochemical reduction. The optical spectra before and after thermochemical reduction are shown in FIG. 2 for an impure MgO crystal. The absorption peak at 4.3 eV in the as-received crystal is due to $Fe^{3+}$. After thermochemical reduction (TCR) a band at 5.0 eV, presumably due to anion vacancies, and a broad band which peaks between 3 and 4 eV emerged. Analytical transmission electron microscopy techniques indicated that the presence of precipitates which were primarily Fe in content. Microdiffraction patterns indicated that the precipitates possessed the FCC ($a_o=3.61$ angstroms) or the BCC ($a_o=2.89$ angstroms) crystal structure. The FCC precipitates were found to have a matrix-relationship of $<001>_p \parallel <001>_m$ and $<010>_p \parallel <010>_m$, where the subscripts p and m refer to precipitates and matrix, respectively. The BCC precipitates were found to have a relationship of $<001>_p \parallel <001>_m$ and $<110>_p \parallel <010>_m$. Thus the increase in temperature in the thermochemical reduction process of about 100° to 300° C. above that used in the prior art enhances the outdiffusion of trace metallic impurities such as Fe in MgO.

Although the invention has been described by means of examples employing MgO and CaO, it will be understood that other refractory oxide crystals may be prepared in like manner for laser host applications. The reason for this is that in a strongly reducing atmosphere of cation metallic vapor, anion vacancies are the predominant species rather than anion interstitials or cation metallic precipitate. More specifically, refractory oxides such as MgO, $Al_2O_3$, CaO and SrO are the preferred materials for laser hosts because they are normally stoichiometric.

I claim:

1. A method of preparing a refractory oxide laser host material having high quantum efficiency, high thermal stability, and high useful luminescence in the nanoseconds range comprising the steps of:
   (a) removing substantially all of the hydrogen from a single crystal of said refractory oxide to a level of less than about $10^{13}$ protons/cm$^3$ by the simultaneous steps of heating said crystal to a temperature sufficient to dissociate hydrogen from OH$^-$ bonds within said crystal and applying an electric field across said crystal to sweep the dissociated hydrogen ions from said crystal;
   (b) further heating said crystal in an atmosphere of a cation vapor of said refractory oxide at an elevated pressure and temperature sufficient to thermochemically reduce the oxygen content of said crystal to form oxygen (anion) vacancies within said crystal so that $F^+$ luminescence is produced when said crystal is optically excited by light of a wavelength within the absorption band of said crystal, said temperature being sufficient to remove contaminants by means of outdiffusion during thermochemical reduction of the oxygen in said crystal, thereby preventing crystal darkening; and
   (c) irradiating said crystal with electrons sufficient to inactivate trace amounts of H$^+$ ions, thereby improving the ratio of short-lived to long-lived luminescence following optical excitation.

2. The method of claim 1 wherein said irradiating step includes irradiating said crystal for a period of about 10 minutes with 1.8 MeV electrons.

3. The method of claim 1 wherein said refractory oxide is selected from the group consisting of MgO, CaO, and SrO.

* * * * *